United States Patent
Miyabe et al.

(10) Patent No.: US 7,113,528 B2
(45) Date of Patent: Sep. 26, 2006

(54) SEMICONDUCTOR LASER DEVICE

(75) Inventors: Kazuyuki Miyabe, Kawasaki (JP);
Hiroyuki Sawano, Kawasaki (JP);
Hitoshi Hotta, Kawasaki (JP)

(73) Assignee: NEC Electronics Corporation (JP)

( * ) Notice: Subject to any disclaimer, the term of this patent is extended or adjusted under 35 U.S.C. 154(b) by 289 days.

(21) Appl. No.: 10/622,061

(22) Filed: Jul. 17, 2003

(65) Prior Publication Data

US 2004/0028097 A1 Feb. 12, 2004

(30) Foreign Application Priority Data

Jul. 18, 2002 (JP) .............................. 2002-209699

(51) Int. Cl.
*H01S 3/04* (2006.01)
(52) U.S. Cl. ...................... 372/36; 372/43.01; 372/75
(58) Field of Classification Search ............. 372/43.01, 372/36, 75, 46.011, 44.01
See application file for complete search history.

(56) References Cited

U.S. PATENT DOCUMENTS

2003/0026303 A1\* 2/2003 Ouchi ........................ 372/36
2003/0174753 A1\* 9/2003 Yabuki et al. ................ 372/50

FOREIGN PATENT DOCUMENTS

| JP | 63-164264 | 10/1988 |
|---|---|---|
| JP | 05-082904 | 4/1993 |
| JP | 09-061676 | 3/1997 |
| JP | 10-289468 | 10/1998 |
| JP | 2000-011417 | * 1/2000 |
| JP | P2002-198610 A | * 12/2000 |
| JP | 2001-267674 | 9/2001 |
| JP | 2001-284731 | 10/2001 |
| JP | 2002-198610 | 7/2002 |
| WO | 00/04614 | 1/2000 |

\* cited by examiner

*Primary Examiner*—Minsun Oh Harvey
*Assistant Examiner*—Tuan N. Nguyen
(74) *Attorney, Agent, or Firm*—Hayes Soloway P.C.

(57) ABSTRACT

A first semiconductor laser element and a second semiconductor laser element are arranged on an identical block, a first electrode of the first semiconductor laser element is in direct contact with the block, and heat radiating effect is high. A second electrode of the second semiconductor laser element is arranged on an insulating dielectric layer, and the block and second semiconductor laser element are electrically insulated. Therefore, irrespective of the material to compose the block, the first semiconductor laser element and the second semiconductor laser element can be independently driven. In addition, the light emitting point distance between the first semiconductor laser element and second semiconductor laser element is limited only by the distance between the electrodes of the respective semiconductor lasers and the positions of light emitting points on the semiconductor laser chip end face and can, therefore, be made as short as possible.

17 Claims, 7 Drawing Sheets

SEMICONDUCTOR LASER DEVICE

BACKGROUND OF THE INVENTION

1. Technical Field of the Invention

The present invention relates to a semiconductor laser device and, more particularly, to a semiconductor laser device to be used as an optical disk light source of optical communications equipment or optical information equipment for DVDs (Digital Versatile Discs) and CDs (Compact Discs), etc.

2. Description of the Related Art

In general, in order to efficiently radiate heat generated during operation, a semiconductor laser is frequently fusion-bonded and fixed to a high-heat conductivity block. On the other hand, in order to realize a further downsizing of the semiconductor laser device, a semiconductor laser device is demanded which allows a plurality of light sources to be integrated into one package and, furthermore, allows a plurality of light sources to be mounted on one block so as to emit a plurality of laser beams. For example, in recent optical disk systems where light sources are used for reading and writing to CDs and DVDs, an infrared semiconductor laser with both a 780 nm-band wavelength region for CDs with a large light spot diameter and a red semiconductor laser with a 650 nm-band wavelength region for DVDs and having a small light spot diameter are integrated into one package. From the viewpoint of this optical pickup configuration, the light emitting point distance between these semiconductor lasers needs to be approximately 100 μm or less.

A technique for downsizing of semiconductor laser devices, is taught in Japanese Unexamined Patent Publication No. Hei-10-289468. This publication discloses a technique wherein two semiconductor lasers with different wavelengths are arranged side by side and unitized. In addition, Japanese Unexamined Patent Publication No. 2000-11417 discloses a technique wherein a plurality of semiconductor lasers with different wavelengths are build into one chip.

In semiconductor laser devices according to such prior art, two electrodes, which are formed on an insulating block so as to be electrically insulated from each other, and a first semiconductor laser and a second semiconductor laser are arranged on said electrodes via solder or the like, respectively. By employing such a configuration, the first semiconductor laser and second semiconductor laser can each be independently driven on an identical block. Accordingly, it becomes possible to realize a structure wherein the light emitting point distance between these semiconductor lasers is limited only by the distance between two electrically insulated and independent electrodes and the positions of light emitting points on the semiconductor laser end face.

However, in a case where an insulating block or the like is used, material which can be used for this block or the like is restricted by quality and its physical properties. In addition, many materials which may be used for an insulating block or the like have low workability and are difficult to process. Furthermore, in a case where a photodiode for monitoring laser output is provided on an identical block or the like, this photodiode must be additionally mounted, and therefore, the number of components to be mounted on the block is increased, causing an increase in the number of manufacturing steps and manufacturing costs.

For example, as shown in FIG. 1, in a case where a semiconductor laser device is constructed without limitation in material of the insulating block, a dielectric layer 5 is formed on a block 101, and on this dielectric layer 5, a first electrode 61 and a second electrode 62 are formed in a mutually isolated manner, and then, a first semiconductor laser element 31 and a second semiconductor laser element 32 are arranged by joining on the first electrode 61 and second electrode 62 via solder 65, respectively. At this time, if the first electrode 61 and second electrode 62 are out of contact, the respective semiconductor laser element 31 and 32 will be electrically insulated and, therefore, can be independently driven. However, in the case of the semiconductor laser device of FIG. 1, the dielectric layer 5 is interposed between the block 101 and semiconductor laser elements 31 and 32. The dielectric layer 5 generally has low heat conductivity compared to other materials such as a semiconductor and a metal. Therefore, when a semiconductor laser whose heat generation during driving is great or whose heat radiation from its exposed surface is small and a semiconductor laser sensitive to a change in temperature are mounted on the dielectric layer, the temperature characteristics of the semiconductor lasers on this dielectric layer are considerably deteriorated.

On the other hand, Japanese Unexamined Patent Publication No. Hei-5-82904 discloses a technique which provides, although this is a semiconductor laser device provided with a single semiconductor laser, a semiconductor block which functions as a heat radiating member and also as a semiconductor laser light output monitoring photodiode by utilizing an n-type semiconductor substrate for a semiconductor laser mounting block. In this prior art, by forming a p-type semiconductor on a part of the n-type semiconductor block surface, a function such as a photodiode can be provided by this block itself. In addition, on a second portion of the n-type semiconductor block surface a p-type semiconductor is formed, an n-type semiconductor layer is further mounted on this p-type semiconductor surface, and on this n-type semiconductor surface, a semiconductor laser is arranged via an electrode and solder.

Based on this prior art, a semiconductor block functions as a heat radiating member and as a light output monitoring photodiode, and thus a semiconductor laser device mounted with a plurality of semiconductor lasers can also be considered. For example, as shown in FIG. 2, a p-type semiconductor layer 2 is formed on a part of the surface of an n-type semiconductor block 1, and on the surface of this p-type semiconductor layer 2, two n-type semiconductor layers 3 are formed in a mutually separated manner. Then, on one n-type semiconductor layer 3, a semiconductor laser element 31 is arranged via a first electrode 61 and solder 65. In addition, on the other n-type semiconductor layer 3, a second semiconductor laser element 32 is arranged via a second electrode 62 and solder 65. On the upper surface of the respective semiconductor laser elements 31 and 32, a semiconductor laser electrode 24 is formed.

In a semiconductor laser device with the aforementioned structure, the first semiconductor laser element 31 and second semiconductor laser element 32 are electrically insulated by an npn structure composed of one n-type semiconductor layer 3, the p-type semiconductor layer 2, and the other n-type semiconductor layer 3. Accordingly, the respective semiconductor laser elements 31 and 32 can be independently driven. In this semiconductor laser device as shown in FIG. 2, which is different from the semiconductor laser device shown in FIG. 1, because the semiconductor laser elements 31 and 32 are mounted on a semiconductor block higher in heat conductivity than the dielectric layer. Thus, no considerable deterioration in temperature characteristics of the respective semiconductor laser elements 31 and 32 occurs.

However, in the semiconductor laser device shown in FIG. 2, in order to maintain electrical insulating characteristics of the respective semiconductor laser elements 31 and 32, an npn structure must be formed. Therefore, for the light emitting point distance between these semiconductor laser elements 31 and 32, in addition to the distance between the first electrode 61 and second electrode 62 and the positions of light emitting points on the semiconductor laser end face, the distance between the n-type semiconductor layers 3 is determined by the size of the npn structure required for preventing conduction of the respective semiconductor laser elements 31 and 32. Accordingly, the light emitting point distance between the semiconductor laser elements 31 and 32 is unnecessarily expanded, and therein exists a problem.

On the other hand, a domestic republication WO00/04614 of a PCT international publication for patent application as the purpose of providing a semiconductor laser device which can realize an optical pickup capable of reading and writing information with respect to different optical disks by an assembling technique equivalent to that of a conventional optical pickup without increasing the number of components on a heat radiating block. This publication discloses a semiconductor laser device wherein first and second semiconductor laser elements are mounted on a heat radiating block so that, where the distance between an emerging light axis of the first semiconductor laser element and a condenser lens center axis is provided as d1, i.e. the distance between an emerging light axis of the second semiconductor laser element and a condenser lens center axis is provided as d2, and the distance between the emerging light axes of the first and second semiconductor laser elements is provided as L, wherein $0 \leq L \leq d1+d2 < 160$ μm.

Moreover, FIG. 3 shows a semiconductor laser device described in this publication, a sub-mount 132 is mounted on a heat radiating block 131 and semiconductor lasers 133 and 134 are mounted on the heat radiating block 131 and on the sub-mount 132, respectively, so that emerging light axes 135 and 136 of the respective semiconductor lasers become identical in the level of height. Furthermore, a distance therebetween is thus made into a minimum value so as to restrain the distance between the emerging light axes to be a desirable 160 μm or less.

Moreover, in this prior art, for the reason that a light output monitoring photodiode can be formed on the sub-mount, a silicon semiconductor is particularly preferable.

However, in this prior art, no concrete means for enhancing heat radiation characteristics of semiconductor laser elements to be mounted or no concrete means for improving temperature characteristics of semiconductor laser elements is disclosed.

SUMMARY OF THE INVENTION

It is an object of the present invention to provide a semiconductor laser device which allows, irrespective of the material type of a block or the like for mounting a plurality of semiconductor laser elements, improved heat radiating characteristics of the semiconductor laser elements so as to improve the temperature characteristics of these semiconductor lasers and to make the light emitting point distance between the semiconductor laser elements as short as possible.

A semiconductor laser device according to the present invention comprises: a heat radiating block; one or more first semiconductor laser element(s) arranged on the heat radiating block in a manner where one electrode is in contact therewith; and one or more second semiconductor laser element(s) arranged on the heat radiating block in an electrically insulated manner via a dielectric layer.

The first and second semiconductor laser elements may also be constructed as semiconductor lasers integrated onto one chip. In this case, the first semiconductor laser element part of this one-chip makes one electrode thereof be in contact with the block, the second semiconductor laser element part is provided on the dielectric layer.

Moreover, the heat radiating block is preferably an electrical conductor or a semiconductor.

Moreover, onto the heat radiating block, a light output monitoring photodiode may be built.

Furthermore, the dielectric layer is appropriately formed of one type selected from a group composed of silicon oxide, silicon nitride, titanium oxide, aluminum oxide, and aluminum nitride.

Furthermore, the first semiconductor laser element in direct contact with the heat radiating block is preferably greater in heat generation during driving or smaller in heat radiation from an element exposed surface than the second semiconductor laser element formed on said heat radiating block via said dielectric layer.

Furthermore, the first semiconductor laser element may be a semiconductor laser to emit a laser beam with a 650 nm-band wavelength, and the second semiconductor laser element may be a semiconductor laser to emit a laser beam with a 780 nm-band wavelength.

THE PREFERRED EMBODIMENTS OF THE INVENTION

Figure 4:
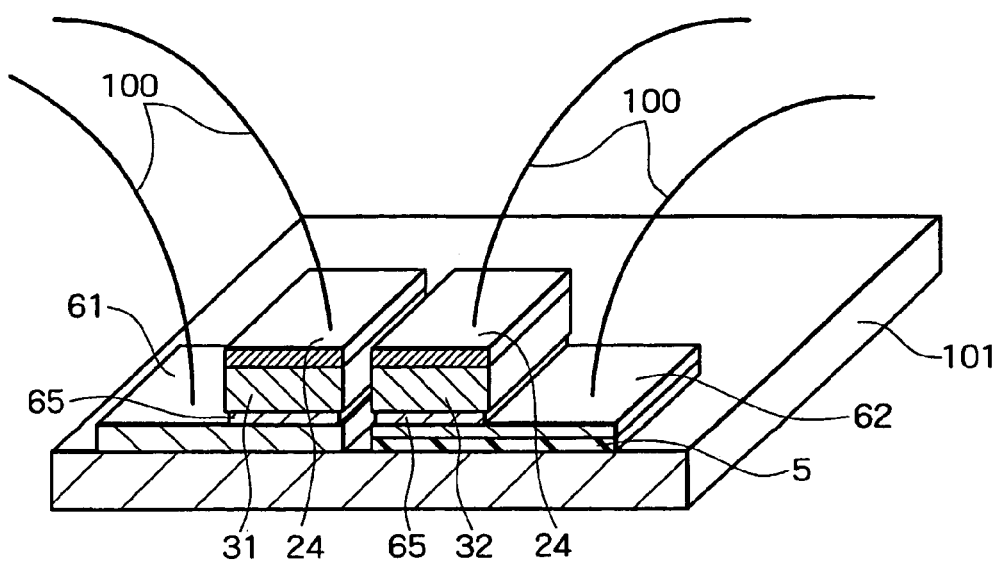
FIG. 4 is a perspective view showing the first embodiment of the present invention.

Hereinafter, an embodiment of the present invention will be described in detail with reference to the attached drawings. FIG. 4 is a perspective view showing a semiconductor laser device according to a first embodiment of the present invention. In the present embodiment, a first electrode 61 is provided on a block 101 so as to be in direct contact with the same, and on a block 101 in the vicinity of this first electrode 61, a second electrode 62 is provided via a dielectric layer 5. Then, a first semiconductor laser element 31 is joined on the first electrode 61 by solder 65, and a second semiconductor laser element 32 is joined on the second electrode 62 by solder 65. In addition, on the upper surfaces of the first and second semiconductor laser elements 31 and 32, semiconductor laser electrodes 24 are formed, respectively.

Moreover, conductive wires 100 are bonded to the electrode 24 on the first electrode 61 and first semiconductor laser element 31 and the electrode 24 on the second electrode 62 and second semiconductor laser element 32, respectively, and by these conductive wires 100, the respective semiconductor laser elements 31 and 32 are connected to their drive power supply (not shown).

According to the present embodiment, the first semiconductor laser element 31 and second semiconductor laser element 32 are arranged on an identical block 101, and the second semiconductor laser element 32 is arranged, via the solder 65, on the second electrode 62 formed on the insulating dielectric layer 5 on the block 101. By this formation of the second electrode 62 on the dielectric layer 5, the block 101 and the second semiconductor laser element 32 are electrically insulated. Therefore, material of the block 101 is not limited to an insulator. Accordingly, as this block 101, an inexpensive material whose heat conductivity is high and processing is easy can be freely selected. Moreover, this block 101 is preferably formed of an electrically conductive material or a semiconductor material since their heat conductivity is high and processing is easy.

In addition, since the first semiconductor laser element 31 is arranged on the block 101 so as to be in direct contact with the same without interposing a low-heat conductivity dielectric layer or the like, heat radiating characteristics during driving can be satisfactorily maintained. Accordingly, because the first semiconductor laser element 31 is directly arranged on the block 101, a semiconductor laser element whose heat generation during diving is greater or whose heat radiation from its exposed surface is smaller than that of the second semiconductor laser 32, a semiconductor laser more sensitive to a change in temperature and the like is preferable. Thereby, the temperature characteristic of the first semiconductor laser element 31 which easily reaches a high temperature or whose temperature characteristics are strict can be improved. In addition, the light emitting point distance between the first semiconductor laser element 31 and second semiconductor laser element 32 is structurally limited only by the distance between the first electrode 61 and second electrode 62 and the positions of light emitting points on the semiconductor laser end face and can therefore be made as short as possible. This can be accomplished by employing an asymmetrical structure as a semiconductor laser element mounting method, controlling the degree of freedom of the light emitting point distance between the semiconductor laser elements and securing of heat radiating characteristics of the semiconductor laser element whose heat generation is great during driving can be simultaneously realized.

As for the materials used to form the block 101, a conductor or semiconductor such as silicon (Si), germanium (Ge), GaAs (gallium arsenide compound), or another compound semiconductor is preferred. In particular, an n-type silicon semiconductor is appropriate since this is inexpensive, allows easy processing, and it is easy to carry out the formation of an insulating region and the formation of a light output monitoring photodiode by an addition of a doping step.

As for the materials used to form the dielectric layer 5, silicon oxide, silicon nitride, titanium oxide, aluminum oxide, and aluminum nitride, etc., are preferred. In addition, in a case of a DC-drive of the first semiconductor laser element 31 mounted on the dielectric layer 5, the thickness of the dielectric layer 5 is desirably 10 nm or more, and in a case of a modulation drive of this first semiconductor laser element 31, the thickness of the dielectric layer 5 is desirably 300 nm or more. In the case of a modulation drive of the first semiconductor laser element 31 mounted on the dielectric layer 5, the dielectric layer 5 functions as a capacitor and a leak current may flow via this electrical capacity. Therefore, it is necessary to reduce the electric capacity of this dielectric layer 5 to prevent a leak current from flowing. Therefore, in the case of a modulation drive of the first semiconductor laser element 31 mounted on the dielectric layer 5, the dielectric layer 5 must be formed thicker. As such, by adjusting the thickness of the dielectric layer 5 according to the driving method of the first semiconductor laser element 31 formed on the dielectric layer 5, the first semiconductor laser element 31 and the second semiconductor laser element 32 can be completely electrically insulated. Moreover, when forming this dielectric layer 5, a layered structure may be provided by layering dielectric layers of different types of silicon oxide, silicon nitride, titanium oxide, aluminum oxide, and aluminum nitride, etc. In addition, by setting the dielectric layer 5 at an arbitrary position on the block 101, emerging light from the first semiconductor laser element 31 and emerging light from the second semiconductor laser element 32 can be directed into arbitrary directions.

In a semiconductor laser device according to the present embodiment, the first semiconductor laser element 31 is provided as a low-output semiconductor laser with a 650 nm-band wavelength (red) and the second semiconductor laser element 32 is provided as a low-output semiconductor laser with a 780 nm-band wavelength (infrared). At this time, the semiconductor laser element 31 with a 650 nm-band wavelength may be formed of an AlGaInP-based material, and the semiconductor laser element 32 with a 780 nm-band wavelength may be formed of an AlGaAs-based material. In such a case, since the AlGaInP-based material forming the first semiconductor laser element 31 is lower in heat conductivity than the AlGaAs-based material forming the second semiconductor laser, heat generation from the first semiconductor laser element 31 is greater during driving. However, by directly arranging this first semiconductor laser element 31 having a low heat conductivity and great heat generation on the block 101 without interposing a dielectric layer, heat radiating characteristics during driving of the first semiconductor laser element 31 can be satisfactorily maintained. As such, in the present embodiment, even for the first semiconductor laser element 31 whose heat generation during driving is great, temperature characteristics thereof are not impaired, and moreover, the distance between the light emitting point of the first semiconductor laser element 31 and the light emitting point of the second semiconductor laser element 32 can be set short, to 80 µm, and furthermore, the respective semiconductor laser elements 31 and 32 can be independently driven.

In the above-described first embodiment, the first semiconductor laser element 31 and the second semiconductor laser element 32 both use a low-output semiconductor laser. Therefore, by directly arranging the first semiconductor laser element 31, which is formed of a low-heat conductivity AlGaInP-based material and whose heat generation during driving is great, on the block 101 without interposing a dielectric layer so that heat generated from this first semiconductor laser element 31 can be radiated via the block 101, temperature characteristics of the whole semiconductor laser device including this first semiconductor laser element 31 poor in heat radiating characteristics can be enhanced. On the other hand, in a case of a semiconductor laser device of a combination of a low-output semiconductor laser and a high-output semiconductor laser, if a low-output semiconductor with a 650 nm-band wavelength and a high-output semiconductor laser with a 780 nm-band wavelength are combined, it is desirable to arrange the high-output semiconductor laser with a 780 nm-band wavelength whose heat generation during driving is great as a first semiconductor laser element 31 and arrange the same on the block 101 without interposing a dielectric layer.

As such, in the present embodiment, it is important to compare two semiconductor lasers to be incorporated into a semiconductor laser device from the viewpoint of heat generating characteristics and heat radiating characteristics of the respective semiconductor lasers and to install, as a first semiconductor laser element 31, a semiconductor laser resulting in poorer temperature characteristics on the block 101 without interposing a dielectric layer. Moreover, material used to form semiconductor lasers in the present embodiment is not particularly limited, and in addition to the above, a combination of semiconductor lasers formed of compounds of Al, Ga, In, N, P, and As, etc., are possible.

Figure 5:
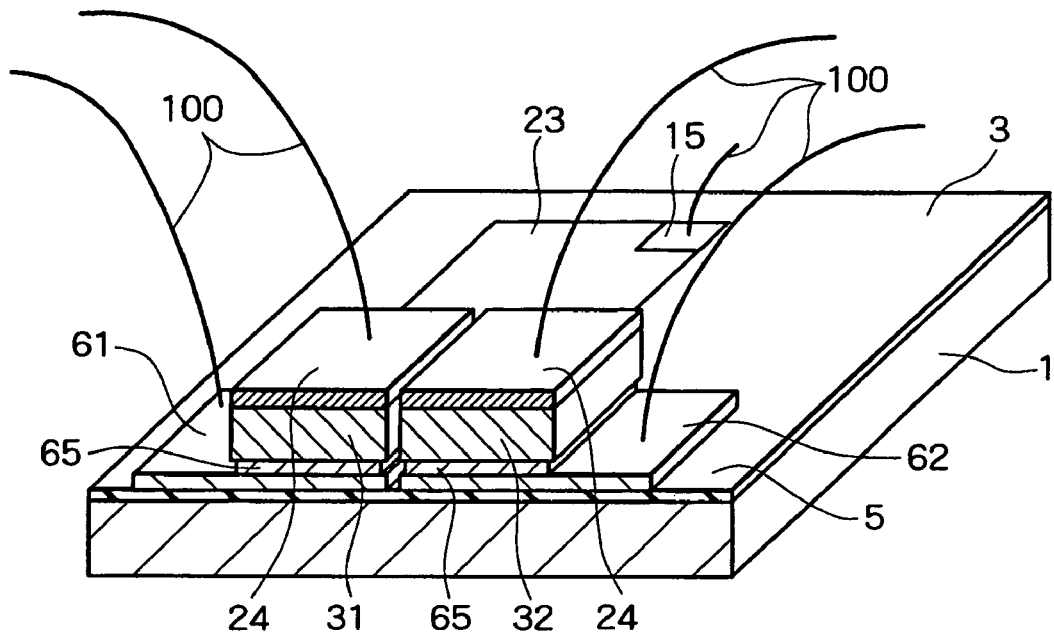
FIG. 5 is a perspective view showing the second embodiment of the present invention.
Figure 6:
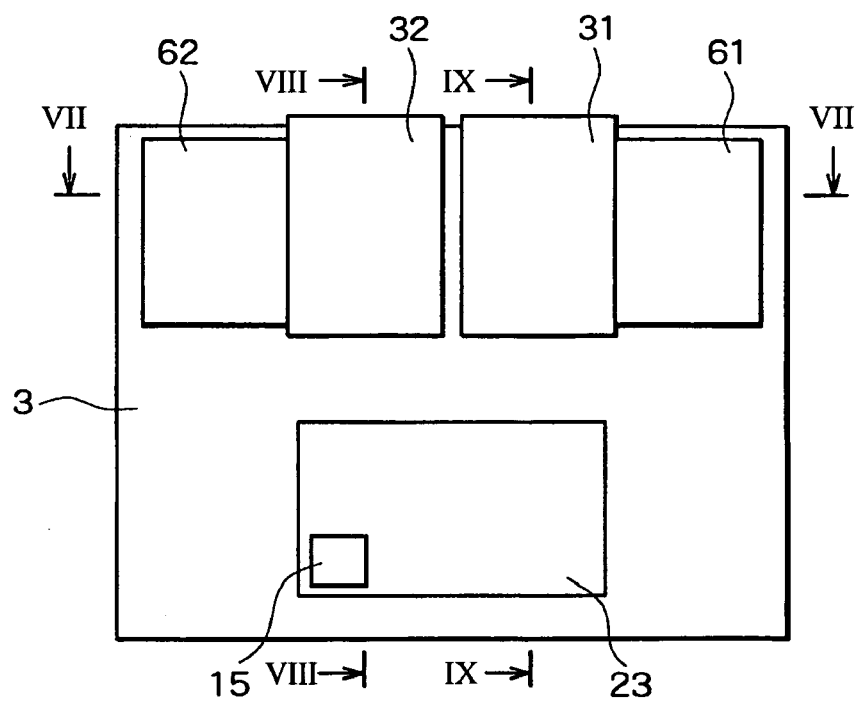
FIG. 6 is a plan view showing the second embodiment of the present invention.
Figure 8:
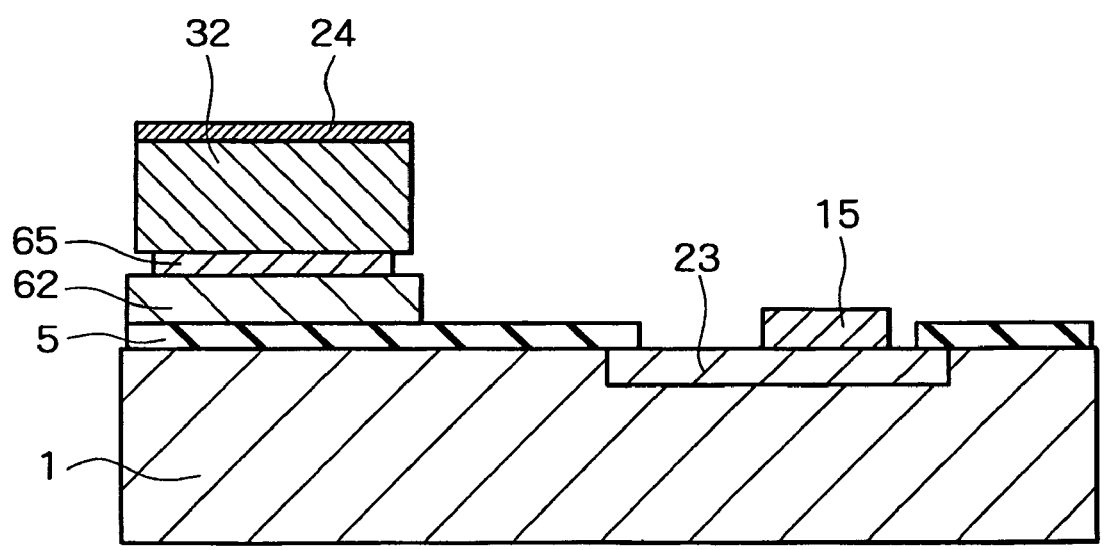
FIG. 8 is a sectional view along VIII—VIII of FIG. 6.
Figure 9:
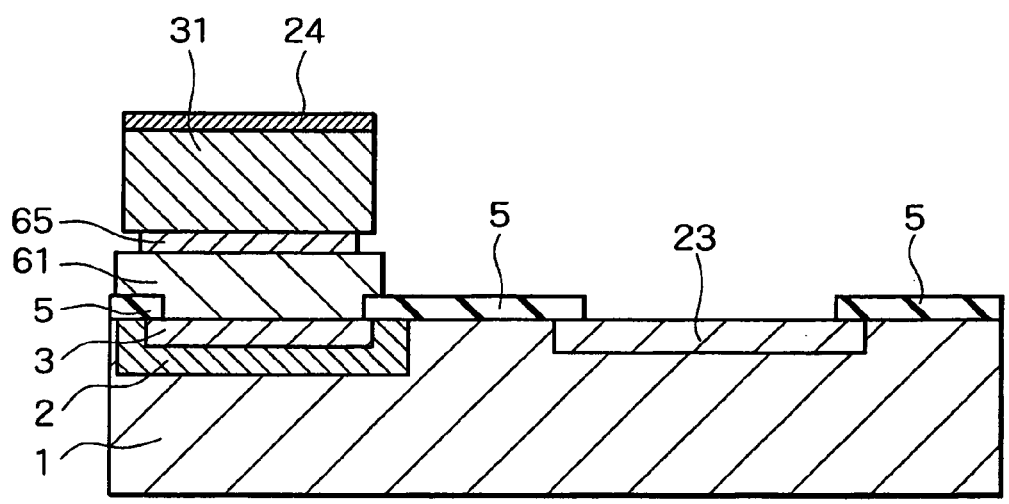
FIG. 9 is a sectional view along IX—IX of FIG. 6.

FIG. 5 is a perspective view showing a semiconductor laser device according to a second embodiment of the present invention, and FIG. 6 is a plan view showing the second embodiment of the present invention. Moreover, FIG. 7 through FIG. 9 are sectional views along VII—VII, VIII—VIII and IX—IX of FIG. 6.

In this second embodiment, as shown in FIG. 5, a dielectric layer 5 is formed on an n-type semiconductor substrate 1, and on a first electrode 61 and a second electrode 62 formed on this dielectric layer 5, a first semiconductor laser element 31 and a second semiconductor laser element 32 are installed via solder 65, respectively. Moreover, as shown in FIG. 7 and FIG. 9, an opening portion is formed at a part of the dielectric layer 5 immediately below the first semiconductor laser element 31, and on the surface of the n-type semiconductor substrate 1, an n-type semiconductor layer 3 is formed across a wider range than the opening portion in the dielectric layer 5, and furthermore, a p-type semiconductor layer 2 is formed in a wider and deeper range than this n-type semiconductor layer 3. The first electrode 61 of the first semiconductor laser element 31 is, at this opening portion of the dielectric layer 5, in direct contact with the n-type semiconductor layer 3 formed on the surface of the n-type semiconductor substrate 1, and the first electrode 61 is directly arranged on the n-type semiconductor substrate 1 without interposing the dielectric layer 5.

In addition, on the surface of the n-type semiconductor substrate 1 on the rear-surface emitting side of the first semiconductor laser element 31 and second semiconductor laser element 32, a p-type semiconductor layer 23 is locally formed, and on a part of this p-type semiconductor layer 23, an anode electrode 15 is formed. This anode electrode 15, the p-type semiconductor substrate 23, and the n-type semiconductor substrate 1 compose a photodiode. In addition, the first electrode 61, the second electrode 62, and semiconductor laser electrodes 24 are connected to a drive power supply (not shown) via conductive wires 100.

Figure 7:
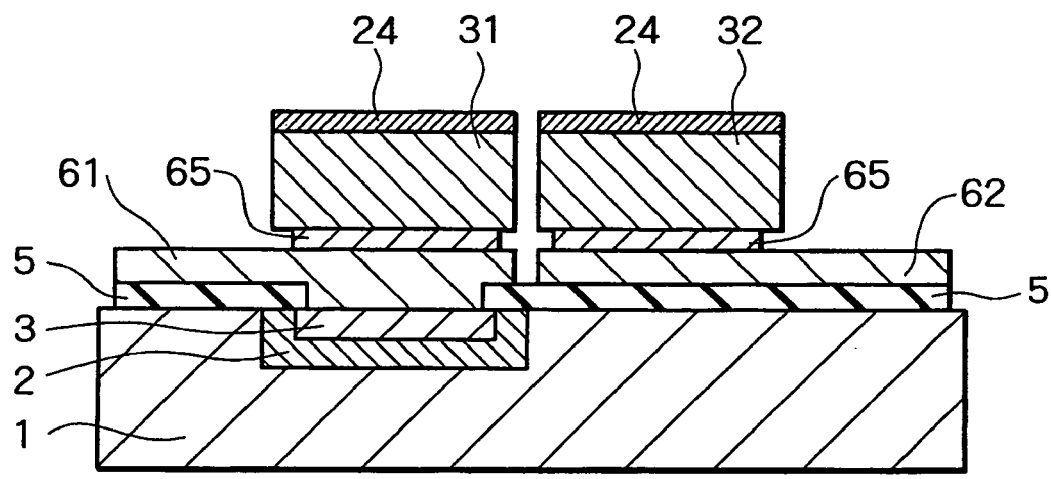
FIG. 7 is a sectional view along VII—VII of FIG. 6.

In a semiconductor laser device of the present embodiment constructed as such, as shown in FIG. 7, immediately below the first semiconductor laser element 31, an opening portion is formed in the dielectric layer 5, and a part of the first electrode 61 is in direct contact with the n-type semiconductor substrate 1. Namely, the first electrode 61 of the first semiconductor laser element 31 is, at least at a part thereof, in contact with the n-type semiconductor layer 3 and p-type semiconductor layer 2 formed on the surface of the n-type semiconductor substrate 1 without interposing the dielectric layer 5. Accordingly, the first semiconductor laser element 31 can radiate heat generated during its driving to the n-type semiconductor substrate 1 at high efficiency.

On the other hand, as shown in FIG. 8, the second semiconductor laser element 32 is formed on the second electrode 62 on the insulating dielectric layer 5 and is, therefore, electrically insulated from the n-type semiconductor substrate 1. Thereby, the first semiconductor laser element 31 and the second semiconductor laser element 32 can be independently driven. Furthermore, the n-type semiconductor layer 3 existing directly below the first semiconductor laser element 31 and the p-type semiconductor layer 23 forming a photodiode are electrically insulated by an npn structure composed of the n-type semiconductor substrate 1 and p-type semiconductor layer 2 interposed therebetween. Therefore, in the present embodiment, the n-type semiconductor substrate 1 that is a semiconductor is used as a block for mounting semiconductor lasers and a photodiode. However, a structure becomes possible wherein the distance between the light emitting point of the first semiconductor laser element 31 and the light emitting point of the second semiconductor laser element 32 is limited only by the distance between the first electrode 61 and second electrode 62 and the positions of light emitting points on the semiconductor laser chip end face. In addition, a photodiode for monitoring laser output can be arranged on the identical block.

As material for the dielectric layer 5, silicon oxide, silicon nitride, titanium oxide, aluminum oxide, and aluminum nitride, etc., are preferred. For completely electrically insulating the n-type semiconductor substrate 1 and elements formed above and on the surface of this n-type semiconductor substrate 1, the thickness of the dielectric layer 5 is desirably 10 nm or more in a case of a DC-drive of the first semiconductor laser element 31 or second semiconductor laser element 32, and in a case of a modulation drive, the thickness is desirably 300 nm or more. In the case of a modulation drive of these semiconductor lasers, the dielectric layer 5 functions as a capacitor and a leak current may flow via this electrical capacity. Therefore, it is necessary to reduce this dielectric layer 5 in electric capacity to prevent a leak current from flowing. Therefore, in the case of a modulation drive of the semiconductor laser elements 31 and 32 to be mounted on the dielectric layer 5, the dielectric layer 5 must be formed thicker. As such, by adjusting the thickness of the dielectric layer 5 according to the driving method of the semiconductor laser elements 31 and 32 formed on the dielectric layer 5, the first semiconductor laser element 31, second semiconductor laser element 32, and photodiode can be completely electrically insulated. Moreover, the dielectric layer 5 can be formed of a laminated layers structure, in which the laminated layers are different each other and selected from the group of silicon oxide, silicon nitride, titanium oxide, aluminum oxide, and aluminum nitride, etc.

In general, since a dielectric layer is low in heat conductivity and poor at heat radiating, it is preferable to install, on the second semiconductor laser formed on the dielectric layer 5, a semiconductor laser with more favorable temperature characteristics, whose heat generation during driving is small and which easily radiates heat. Namely, in the first semiconductor laser element 31 to be installed in electrical conduction with the n-type semiconductor substrate 1 via the opening portion of the dielectric layer 5, it is preferable to select a semiconductor laser element, compared to the second semiconductor laser element 32, whose heat generation during driving is great or heat radiation is small or a semiconductor laser element which is sensitive to a change in temperature and which has strict temperature characteristics. In addition, by setting the second electrode 62 to an arbitrary position on a part of the dielectric layer 5 which does not overlay the p-type semiconductor layer 23, emerging light from the first semiconductor laser element 31 and emerging light from the second semiconductor laser element 32 can be directed into arbitrary directions.

In the semiconductor laser device according to the present embodiment, the first semiconductor laser element 31 is provided as a low-output semiconductor laser with a 650 nm-band wavelength and the second semiconductor laser element 32 is provided as a low-output semiconductor laser with a 780 nm-band wavelength. In this case, the semiconductor laser element 31 with a 650 nm-band wavelength may be formed of an AlGaInP-based material, and the semiconductor laser element 32 with a 780 nm-band wavelength may be formed of an AlGaAs-based material. At this time, since the AlGaInP-based material forming the first semiconductor laser element 31 has lower heat conductivity compared to the AlGaAs-based material forming the second semiconductor laser, heat generation from the first semiconductor laser element 31 is greater during driving. However, by directly arranging at least a part of this first semiconductor laser element 31 having a low heat conductivity and great heat generation on the surface of the n-type semiconductor layer 3 formed on the surface of the n-type semiconductor substrate 1 without interposing a dielectric layer, heat radiating characteristics during driving of this first semiconductor laser element 31 can be satisfactorily maintained. Therefore, without impairing the temperature characteristics of the semiconductor laser with a 650 nm-band wavelength, the distance between the light emitting point of this first semiconductor laser element 31 and the light emitting point of the second semiconductor laser element 32 is 80 μm, and whereby the respective semiconductor laser elements are independently driven. In addition, the photodiode for monitoring light output from these semiconductor laser elements can also be driven without a problem.

In this second embodiment, the first semiconductor laser element 31 and the second semiconductor laser element 32 both use a low-output semiconductor laser. Therefore, by directly arranging at least a part of the first semiconductor laser element 31, which is formed of a low-heat conductivity AlGaInP-based material and whose heat generation during driving is great, on the surface of the n-type semiconductor layer 3 on the surface of the n-type semiconductor substrate 1 without interposing a dielectric layer so that heat generated from this first semiconductor laser element 31 can be radiated via the n-type semiconductor substrate 1, temperature characteristics can be enhanced of the whole semiconductor laser device including this first semiconductor laser element 31 which is poor in heat radiating characteristics. On the other hand, in a case of a semiconductor laser device of a combination of a low-output semiconductor laser and a high-output semiconductor laser, if a low-output semiconductor with a 650 nm-band wavelength and a high-output semiconductor laser with a 780 nm-band wavelength are combined, it is desirable to arrange the high-output semiconductor laser with a 780 nm-band wavelength whose heat generation during driving is as great as a first semiconductor laser element 31 and arrange the same so as to come in contact with the n-type semiconductor substrate 1.

As such, similar to the first embodiment, in the present embodiment as well, it is important to compare two semiconductor lasers to be incorporated into a semiconductor laser device from the viewpoint of heat generating characteristics and heat radiating characteristics of the respective semiconductor lasers and to mount a semiconductor laser resulting in poorer temperature characteristics, as a first semiconductor laser element 31, on the n-type semiconductor substrate 1 without interposing a dielectric layer therebetween. Moreover, material to form semiconductor lasers of the present embodiment is not particularly limited, and in addition to the above, a combination of semiconductor lasers may be formed of compounds of Al, Ga, In, N, P, and As, etc.

Figure 10:
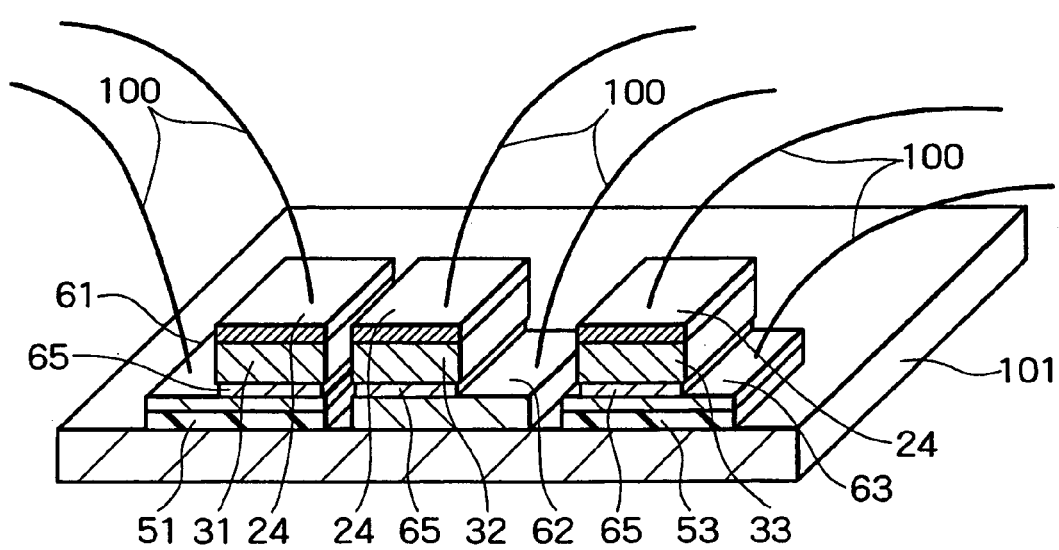
FIG. 10 is a perspective view showing the third embodiment of the present invention.

FIG. 10 is a perspective view showing a third embodiment of the present invention. Dielectric layers 51 and 53 are formed on different parts of a block 101, and arranged, on a first electrode 61 on this dielectric layer 51, a first semiconductor laser element 31 and, on a third electrode 63 on the dielectric layer 53, a third semiconductor laser 33 via solder 65, respectively. In addition, on a second electrode 62 on a part of the block 101 where the dielectric layers 51 and 53 are not formed, a second semiconductor laser element 32 is arranged via solder 65. On the first semiconductor laser element 31, second semiconductor laser element 32, and third semiconductor laser 33, a semiconductor laser electrode 24 is respectively formed. In addition, the first electrode 61, second electrode 62, third electrode 63, and semiconductor laser electrodes 24 are connected to a drive power supply (not shown) via conductive wires 100.

By constructing a semiconductor laser device as in the present embodiment, in addition to the effects of the semiconductor laser device indicated as a first embodiment, a third semiconductor laser can be added. Herein, as material to form the block 101, a conductor or semiconductor such as silicon (Si), germanium (Ge), gallium arsenide compound (GaAs), or another compound semiconductor is preferred. In particular, an n-type silicon semiconductor is appropriate since this is inexpensive, processing is easy, and formation of an insulating region and formation of a light output monitoring photodiode by an addition of a doping step can be easily carried out.

As for material to form the dielectric layer 5, silicon oxide, silicon nitride, titanium oxide, aluminum oxide, and aluminum nitride, etc., are preferred. In addition, in a case of a DC-drive of the first semiconductor laser element 31 and third semiconductor laser 33 mounted on the dielectric layers 51 and 53, the thickness of the dielectric layers 51 and 53 is desirably 10 nm or more, and in a case of a modulation drive of the first semiconductor laser element 31 and third semiconductor laser 33, the thickness of the dielectric layers 51 and 53 is desirably 300 nm or more. In the case of a modulation drive of the first semiconductor laser element 31 and third semiconductor laser 33 to be mounted on the dielectric layers 51 and 53, the dielectric layers 51 and 53 function as capacitors and a leak current may flow via this electrical capacity. Therefore, it is necessary to reduce these dielectric layers 51 and 53 in electric capacity to prevent a leak current from flowing. Therefore, in the case of a modulation drive of the first semiconductor laser element 31 and third semiconductor laser element 33 to be mounted on the dielectric layers 51 and 53, the dielectric layers 51 and 53 must be formed thicker. As such, by adjusting the thickness of the dielectric layers 51 and 53 according to the driving method of the first semiconductor laser element 31 and third semiconductor laser 33 formed on the dielectric layers 51 and 53, the first semiconductor laser element 31, the second semiconductor laser element 32, and the third semiconductor laser 33 can be completely electrically insulated. Moreover, these dielectric layers 51 and 53 can be formed of a laminated layered structure, in which the laminated layers are different from each other and selected from the group of silicon oxide, silicon nitride, titanium oxide, aluminum oxide, and aluminum nitride, etc. In addition, by setting the dielectric layers 51 and 53 at arbitrary positions on the block 101, emerging light from the first semiconductor laser element 31, the second semiconductor laser, and the third semiconductor laser can be directed into mutually arbitrary directions respectively.

Figure 11:
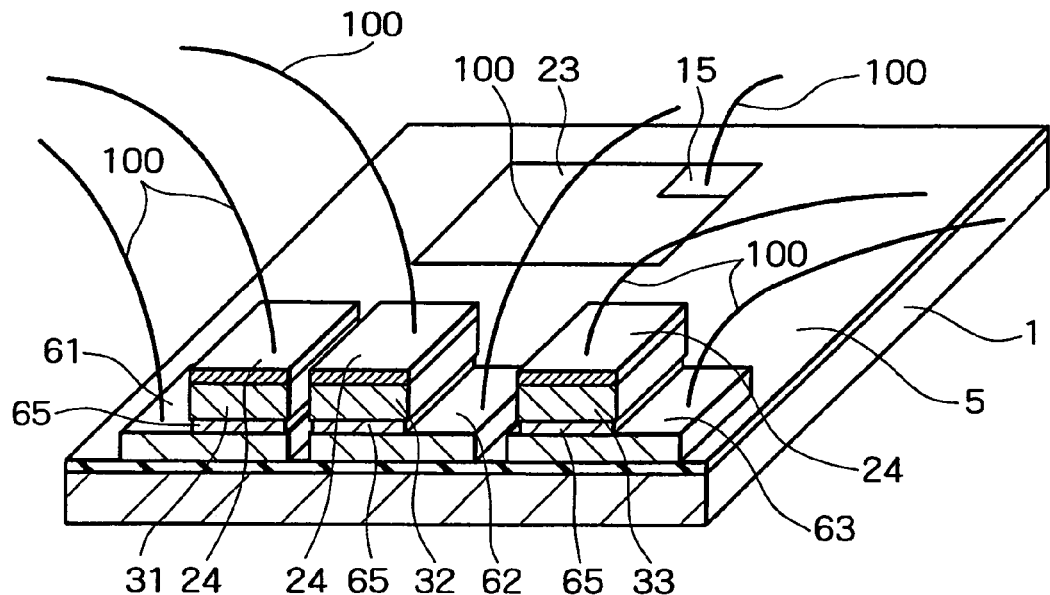
FIG. 11 is a perspective view showing the fourth embodiment of the present invention.

FIG. 11 is a perspective view showing a fourth embodiment of the present invention. In the present embodiment, in a semiconductor laser device constructed similar to the second embodiment, on a dielectric layer 5 formed on a part of an n-type semiconductor substrate 1 different from parts where a first semiconductor laser element 31, a second semiconductor laser element 32, and a p-type semiconductor layer 23 are formed, a third electrode 63 is formed, and on this third electrode 63, a third semiconductor laser 33 is arranged via solder 65. In addition, on the first semiconductor laser, second semiconductor laser, and third semiconductor laser, a semiconductor laser electrode 24 is formed. Furthermore, the first electrode 61, second electrode 62, third electrode 63, and semiconductor laser electrodes 24 are connected to a drive power supply (not shown) via conductive wires 100.

According to the present embodiment, in addition to the effects of the semiconductor laser device indicated as a second embodiment, a third semiconductor laser can be added. As material for the dielectric layer 5, silicon oxide, silicon nitride, titanium oxide, aluminum oxide, and aluminum nitride, etc., are preferred. For completely electrically insulating the n-type semiconductor substrate 1 and elements formed above and on the surface of this n-type semiconductor substrate 1, the thickness of the dielectric layer 5 is desirably 10 nm or more in a case of a DC-drive of the first semiconductor laser element 31, second semiconductor laser element 32, or third semiconductor laser 33, and in a case of a modulation drive, the thickness is desirably 300 nm or more. In the case of a modulation drive of these semiconductor lasers, the dielectric layer 5 functions as a capacitor and a leak current may flow via this electrical capacity. Therefore, it is necessary to reduce this dielectric layer 5 in electric capacity to prevent a leak current from flowing. Therefore, in the case of a modulation drive of the semiconductor laser elements 31, 32, or 33 to be mounted on the dielectric layer 5, the dielectric layer 5 must be formed thicker. As such, by adjusting the thickness of the dielectric layer 5 according to the driving method of the semiconductor laser elements 31, 32, or 33 formed on the dielectric layer 5, the first semiconductor laser element 31, second semiconductor laser element 32, third semiconductor laser 33, and photodiode can be completely electrically insulated. Moreover, when forming this dielectric layer 5, this may be constructed by layering dielectric layers of different types of silicon oxide, silicon nitride, titanium oxide, aluminum oxide, and aluminum nitride, etc.

Figure 1:
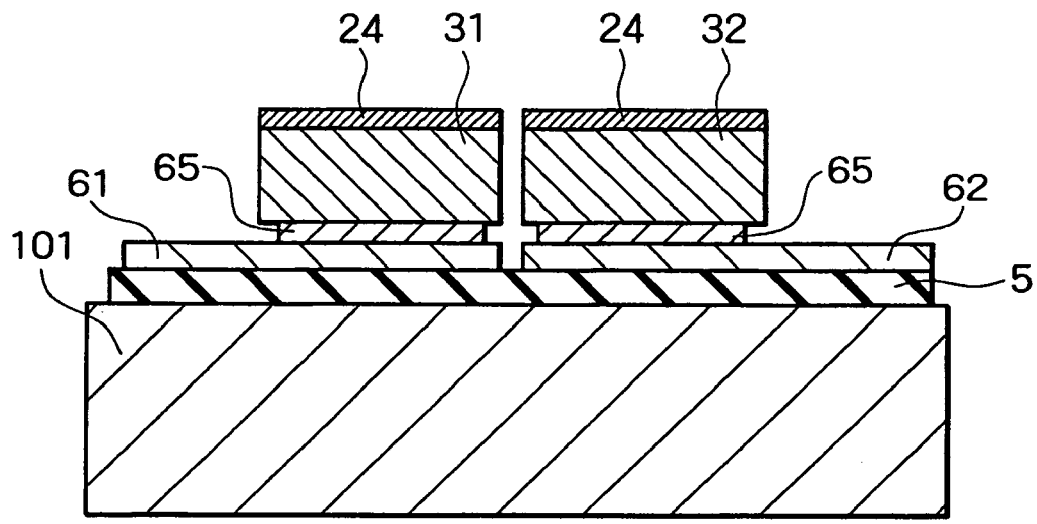
FIG. 1 is a sectional view of a semiconductor laser device according to the first prior art.
Figure 2:
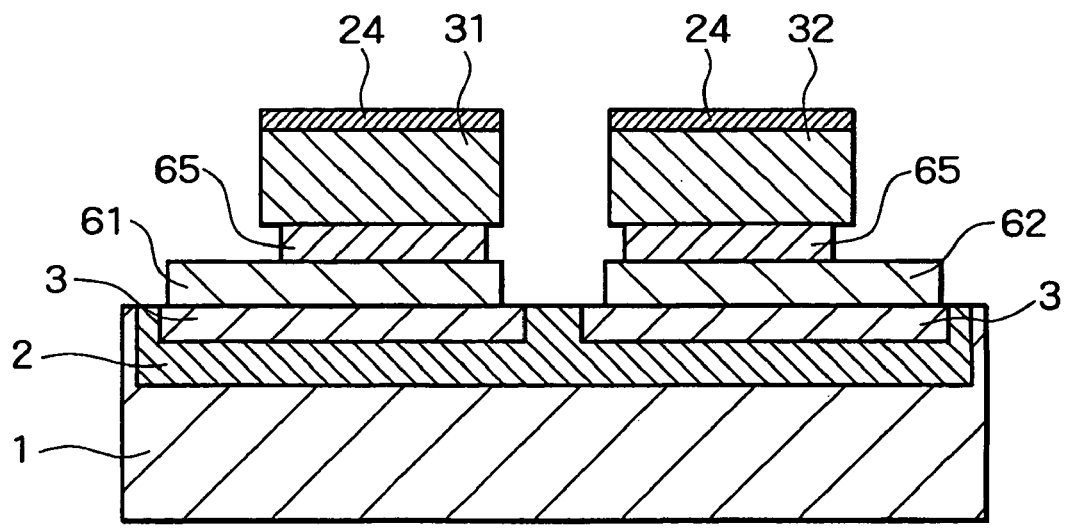
FIG. 2 is a sectional view of a semiconductor laser device according to the second prior art.
Figure 3:
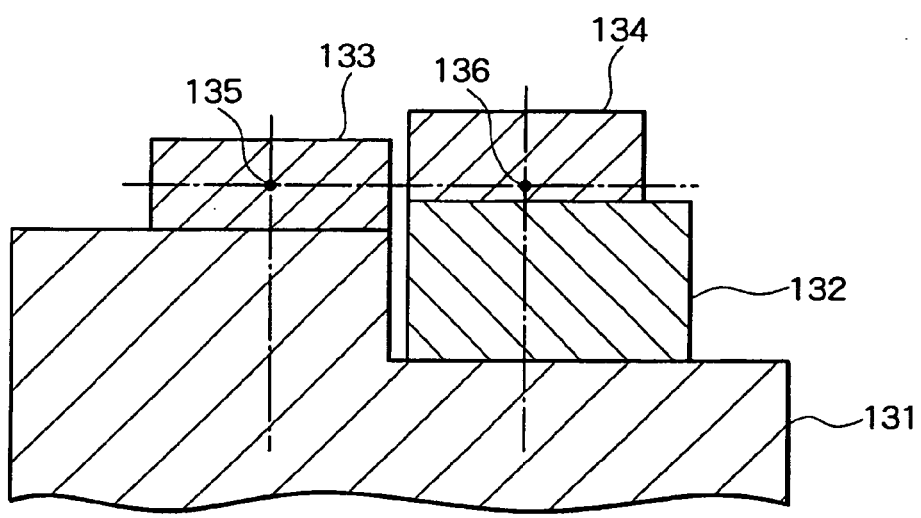
FIG. 3 is a sectional view of a semiconductor laser device according to the third prior art.
Figure 12:
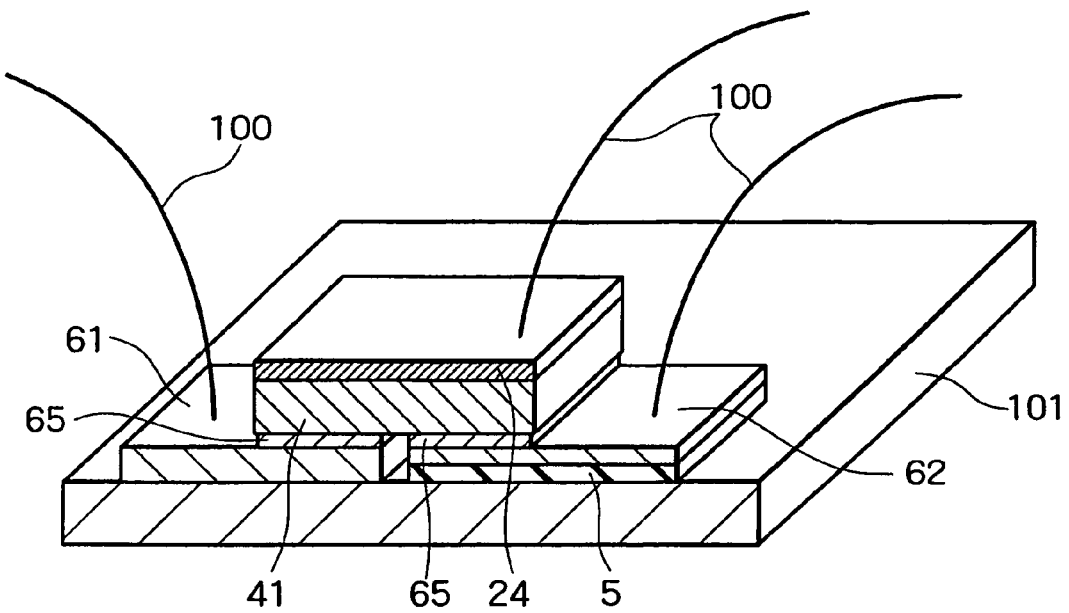
FIG. 12 is a perspective view showing the fifth embodiment of the present invention.

FIG. 12 is a perspective view showing a fifth embodiment of the present invention. In the aforementioned first embodiment (FIG. 1), the two different semiconductor laser elements, the first semiconductor laser element 31 and second semiconductor laser element 32, have been used. However, in this fifth embodiment, a dual light source-type semiconductor laser element 41 is joined on a first electrode 61 and a second electrode 62 via solder 65. On this dual light source-type semiconductor laser element 41, a semiconductor laser electrode 24 is formed. The second electrode 62 is formed on a block 101 via a dielectric layer 5, while the first electrode 61 is directly formed on the block 101, which is similar to the first embodiment. Thereby, a part of one light source of the dual light source-type semiconductor laser element 41 is driven via a conductive wire 100 joined to the first electrode 61 and a conductive wire 100 joined to the semiconductor laser electrode 24, and a part of the other light source of the dual light source-type semiconductor laser element 41 is driven via a conductive wire 100 joined to the second electrode 62 and a conductive wire 100 (common) joined to the semiconductor laser electrode 24.

In the present embodiment, heat radiation of the part of one light source of the dual light source-type semiconductor laser element 41 is more effectively carried out than that of the part of the other light source.

Figure 13:
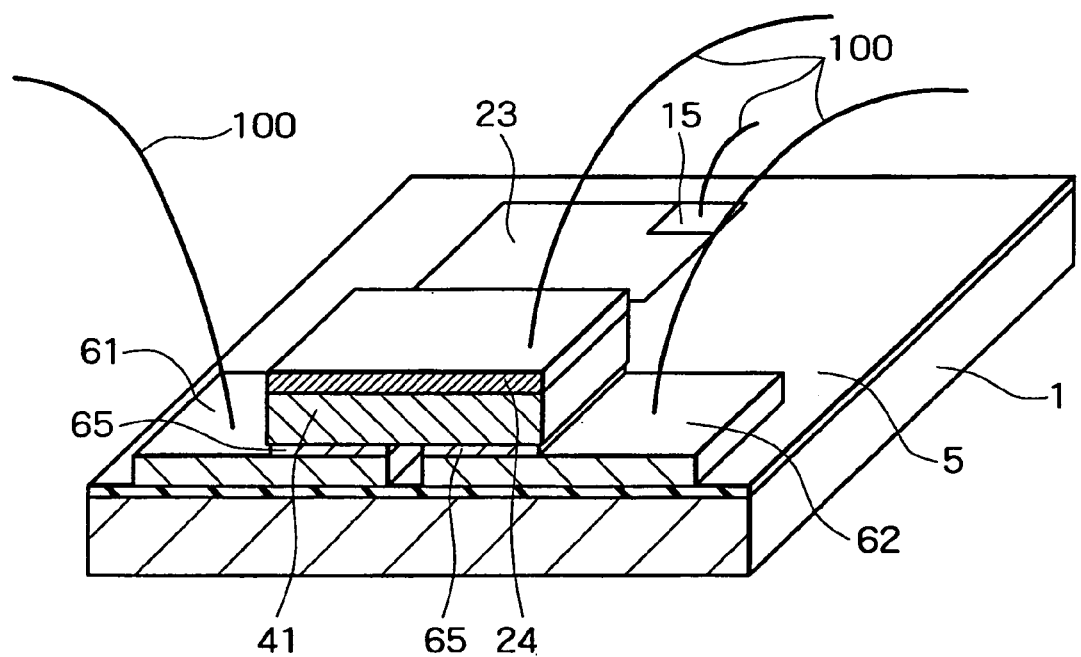
FIG. 13 is a perspective view showing the sixth embodiment of the present invention.

FIG. 13 is a perspective view showing a sixth embodiment of the present invention. In the aforementioned second embodiment, as shown in FIG. 5, a semiconductor laser device is composed of two different semiconductor laser elements, the first semiconductor laser element 31 and second semiconductor laser element 32, and the photodiode. However, in this sixth embodiment, as shown in FIG. 13, instead of using two different semiconductor laser elements, on a first electrode 61 and a second electrode 62 formed on an identical substrate, similar to the fifth embodiment as shown in FIG. 9, a dual light source-type semiconductor laser 41 is joined via solder 65. In this embodiment, as well, effects similar to those of the above-described second embodiment can be obtained.

As has been described in detail in the above, in a semiconductor laser device according to the present invention, the first semiconductor laser element and second semiconductor laser element are arranged on the identical block, the electrode of this first semiconductor laser element is in direct contact with the heat radiating block, therefore, excellent heat radiating characteristics can be obtained, and since the second semiconductor laser element is arranged on the dielectric layer formed on the block, the first semiconductor laser element and second semiconductor laser element are mutually insulated and, therefore, can be independently driven irrespective of the material to compose the heat radiating block. Therefore, a high-heat conductivity material, an electrical conductor, or a semiconductor can be freely selected as a material for the block, and heat generation during driving of the first and second semiconductor laser elements can be effectively radiated. Accordingly, as the first semiconductor laser element, by selecting a semiconductor laser element whose heat generation during driving is greater or whose heat radiation from its exposed surface is small and a semiconductor laser sensitive to a change in temperature, a semiconductor laser device whose temperature characteristics are satisfactory can be obtained. In addition, the light emitting point distance between the first semiconductor laser element and second semiconductor laser element is limited only by the distance between the electrode of the respective semiconductor lasers and the positions of light emitting points on the semiconductor laser chip end face and can therefore be made as short as possible.

What is claimed is:

1. A semiconductor laser device comprising:
   a heat radiating block;
   at least one first semiconductor laser element arranged on said heat radiating block in a manner where one electrode is in direct physical contact therewith; and
   at least one second semiconductor laser element arranged on said heat radiating block, and a dielectric layer arranged to electrically insulate said first semiconductor laser element from said second semiconductor laser element, wherein said second semiconductor laser element is in physical contact with said dielectric layer.

2. The semiconductor laser device as set forth in claim 1, wherein
said first and second semiconductor laser elements are both integrated into one chip, and one electrode of the first semiconductor laser element is in contact with said block, and the second semiconductor laser element is provided on said dielectric layer.

3. The semiconductor laser device as set forth in claim 1, wherein
said heat radiating block is an electrical conductor or a semiconductor.

4. The semiconductor laser device as set forth in claim 2, comprising:
a light output monitoring photodiode built onto said heat radiating block.

5. The semiconductor laser device as set forth in claim 2, wherein
said dielectric layer is formed of a material selected from a group consisting of silicon oxide, silicon nitride, titanium oxide, aluminum oxide, and aluminum nitride.

6. The semiconductor laser device as set forth in claim 2, wherein
said first semiconductor laser element is greater in heat generation during driving or smaller in heat radiation from an element exposed surface than said second semiconductor laser element.

7. The semiconductor laser device as set forth in claim 2, wherein
said first semiconductor laser element is a semiconductor laser to emit a laser beam with a 650 nm-band wavelength, and said second semiconductor laser element is a semiconductor laser to emit a laser beam with a 780 nm-band wavelength.

8. The semiconductor laser device as set forth in claim 2, wherein
said heat radiating block is an electrical conductor or a semiconductor.

9. The semiconductor laser device as set forth in claim 3, comprising:
a light output monitoring photodiode built onto said heat radiating block.

10. The semiconductor laser device as set forth in claim 3, wherein
said dielectric layer is formed of a material selected from a group consisting of silicon oxide, silicon nitride, titanium oxide, aluminum oxide, and aluminum nitride.

11. The semiconductor laser device as set forth in claim 3, wherein
said first semiconductor laser element is greater in heat generation during driving or smaller in heat radiation from an element exposed surface than said second semiconductor laser element.

12. The semiconductor laser device as set forth in claim 3, wherein
said first semiconductor laser element is a semiconductor laser to emit a laser beam with a 650 nm-band wavelength, and said second semiconductor laser element is a semiconductor laser to emit a laser beam with a 780 nm-band wavelength.

13. The semiconductor laser device as set forth in claim 1, comprising:
a light output monitoring photodiode built onto said heat radiating block.

14. The semiconductor laser device as set forth in claim 1, wherein
said dielectric layer is formed of a material selected from a group consisting of silicon oxide, silicon nitride, titanium oxide, aluminum oxide, and aluminum nitride.

15. The semiconductor laser device as set forth in claim 1, wherein
said first semiconductor laser element is greater in heat generation during driving or smaller in heat radiation from an element exposed surface than said second semiconductor laser element.

16. The semiconductor laser device as set forth in claim 1, wherein
said first semiconductor laser element is a semiconductor laser to emit a laser beam with a 650 nm-band wavelength, and said second semiconductor laser element is a semiconductor laser to emit a laser beam with a 780 nm-band wavelength.

17. A semiconductor laser device comprising:

a semiconductor substrate;

a first semiconductor laser element directly provided on said semiconductor substrate;

a second semiconductor laser element in physical contact with a dielectric layer formed on said semiconductor substrate, said second semiconductor laser element being smaller in heat generation during driving; and a photodiode provided on the surface of said semiconductor substrate for monitoring laser output from said first semiconductor laser element or said second semiconductor laser element, wherein said first semiconductor laser element and said photodiode are electrically insulated by a pn structure formed on the surface of said semiconductor substrate.

* * * * *